United States Patent [19]

Crepaldi et al.

[11] 4,078,672
[45] Mar. 14, 1978

[54] DEVICE FOR STEP-FEEDING PANELS TO A MACHINE

[75] Inventors: Sergio Crepaldi, Tronzano (Vercelli); Adriano Buzio, Curino (Vercelli); Romano Cornelio, Santhia' (Vercelli), all of Italy

[73] Assignee: OMCA S.r.l., Vercelli, Italy

[21] Appl. No.: 724,489

[22] Filed: Sep. 20, 1976

[30] Foreign Application Priority Data

Sep. 30, 1975  Italy .............................. 69421 A/75

[51] Int. Cl.² ........................................... B65G 59/00
[52] U.S. Cl. ............................ 214/8.5 A; 214/8.5 H; 221/225; 271/10; 271/22; 271/119
[58] Field of Search ............. 214/8.5 A, 8.5 H, 91 R, 214/7, 6 F; 271/10, 21, 22, 23, 119, 277; 221/225, 231, 236

[56] References Cited

U.S. PATENT DOCUMENTS 2,879,918  3/1959  Zubal .................................. 221/236
3,708,094  1/1973  Koether ....................... 214/8.5 F X Primary Examiner—Trygve M. Blix
Assistant Examiner—George F. Abraham
Attorney, Agent, or Firm—Ladas, Parry, Von Gehr, Goldsmith & Deschamps

[57] ABSTRACT

A device for step-feeding panels, in particular support bases for printed circuits, to a machine, and in which said panels are arranged edgewise on a support plane, and are advanced step-by-step transversely along said support plane and towards one end thereof by a bearing plane moved along said support plane by a powered slide. At said one end of the support plane cyclically movable feeding means are arranged, which support engage the panels moved, at any step, past said one end of the support plane, and displace the same from a first position substantially parallel with the bearing plane to a second position, in which said panels project outwards from said one end of the support plane and operate a means for stopping said movable feeding means.

19 Claims, 12 Drawing Figures

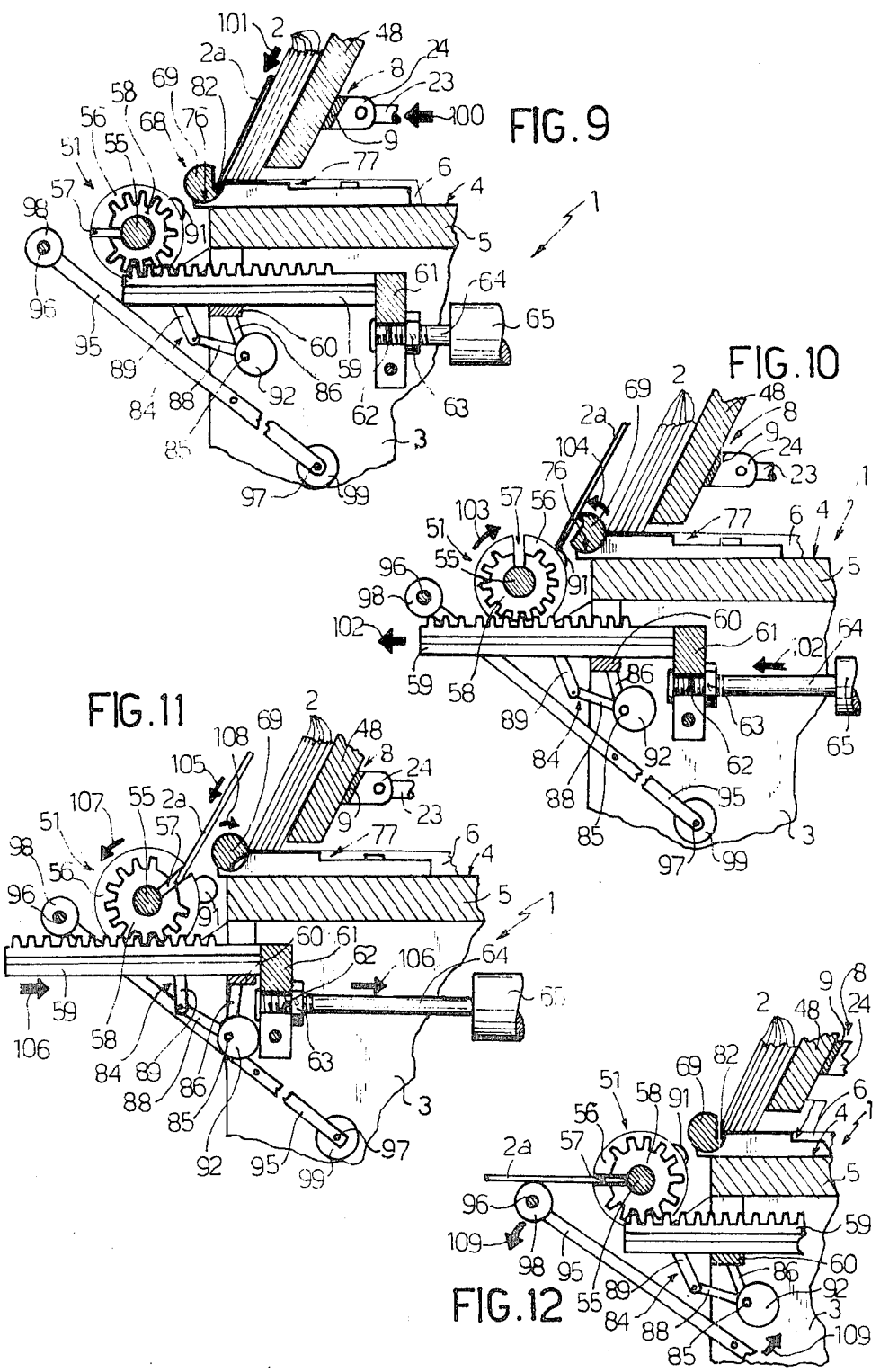

DEVICE FOR STEP-FEEDING PANELS TO A MACHINE

BACKGROUND OF THE INVENTION

This invention relates to device for step-feeding panels to a machine arranged to effect a determinate working on them.

In particular, this invention relates to a feeding device particularly suitable to be utilized for feeding printed circuit support bases to a machine for manufacturing printed circuits.

In the following description, express reference is made to the problem of feeding the support bases to a machine for manufacturing printed circuits, without detracting anything from the generality of the treated problems which remain valid, with negligible variations, for any type of panel to be automatically fed step by step to a working machine.

In the manufacturing of printed circuits, one of the operations most difficult to be automated is the operation of feeding the support bases to a machine for manufacturing printed circuits. It has been devised to resolve this problem by means of belt conveyers arranged to feed the support bases one by one to the printed circuit manufacturing machine; this method, however, has the disadvantage of requiring, generally, an initial manual operation consisting in arranging the support bases one by one on the conveyers. Moreover, expensive devices for linking the conveyers to the printed circuit manufacturing machine are required.

A solution which is less expensive than the one described hereinabove, is based, instead, on the utilization of picking-up sucker assemblies arranged to pick-up the support bases one by one from a stack and to feed them to the printed circuit manufacturing machine. This solution, which is very similar to that applied for feeding paper sheets to the printing presses, is much more compact and economical than the preceding one, but has the disadvantage that it can be applied only in case of support bases having a minimum number of holes, and for a mass-production only. In fact, it is evident that the arrangement of the pick-up suckers must be such that none of them is situated in face of a hole, which would render uneffectual the sucker, and that such arrangement must be varied according to the type of support bases to be fed. Moreover, the suckers cannot be utilized when the density of the holes is such as not to allow the application of a sucker in any portion of the support base.

It results from the foregoing that no satisfactory solution has been found till now for the problem of providing a feeding device which is not only compact and economical, but also reduces to a minimum the manual operations and its multivalent, i.e. may be utilized for any type of support base or panel.

SUMMARY OF THE INVENTION

The bove problem is, instead, brilliantly resolved by the feeding device according to the present invention, inasmuch as it comprises, in combination:

a support plane for said panels, the panels being disposed substantially edgewise;

a slide movable along said support plane from and towards a first end of said plane under the thrust of first driving means;

a bearing plane for said panels which is rigidly connected to an end of said slide which is situated in face of said first end of the support plane, said bearing plane being inclined with respect to the vertical and towards a second end of the support plane opposite said first end of the latter;

feeding means adjacent said first end of said support plane and arranged to support and engage said panels as these are pushed beyond said first end of the support plane, said feeding means being configurated in such a way as to be able to support and engage at least the panels which simultaneously pass said first end of said support plane, and being cyclically movable under the action of second driving means to move these panels from a first position, substantially parallel with said bearing plane, to a second position in which these panels are projecting with respect to said first end of the support plane;

first retaining means for stopping said first driving means during at least a part of the operation of said second driving means; and second retaining means arranged to cooperate with the panels in said second position for stopping said second driving means.

According to a further characteristic of the present invention, said panels disposed edgewise form at least one stack in which the lowest panel is in contact with said bearing plane; said first retaining means being disposed at said first end of said support plane and comprising picking-up means arranged to cooperate with the first panel of said stack and movable with said feeding means in order to supply to these latter, at each cycle, said first panel after having picked it up from said stack.

Finally, positioner means actuated by said second driving means are preferably interposed between said pick-up means and said feeding means for supporting said first panel till it engages said feeding means.

BRIEF DESCRIPTION OF THE DRAWINGS

Further characteristics and advantages of the present invention will become apparent from the following description made with reference to the accompanying drawings which show a non limitative embodiment of the invention and in which:

FIGS. 9, 10, 11 and 12 are cross-sections similar to that of FIG. 6 and relating to four different moments of the operation of the devise shown in FIG. 1.

DETAILED DESCRIPTION OF THE INVENTION

Figure 1:
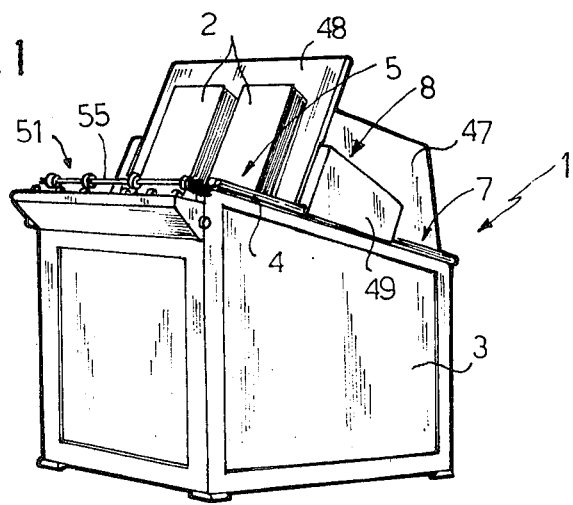
FIG. 1 is a perspective three-quarter view from the bottom of a feeding device constructed according to the principles of the present invention.
Figure 4:
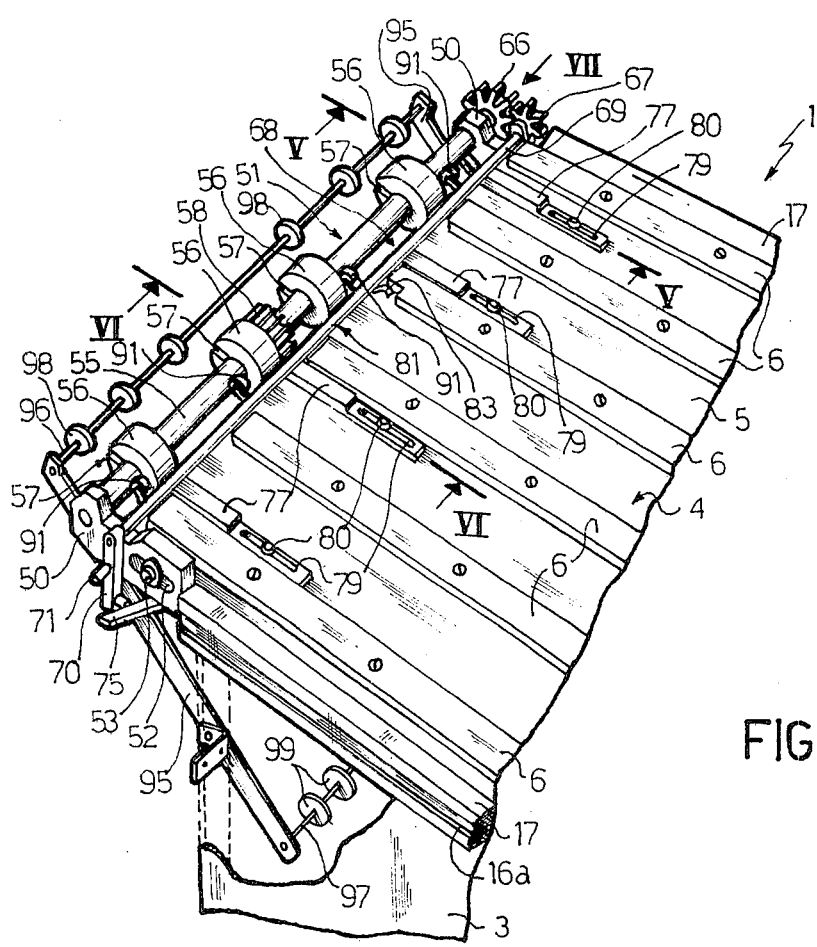
FIG. 4 is a perspective three-quarter from the top and to enlarged scale of a front portion of the device shown in FIG. 1.

FIG. 1 shows a feeding device, indicated generally by reference numeral 1, for step-feeding printed circuit support bases 2 to a machine (not shown) disposed opposite the leading end of the device 1 and arranged to print the circuits on the support bases 2.

The device 1 comprises a box-type casing 3 limited on the upper side by a table 4 which is inclined upwards and towards the leading part of the device 1 by angle comprised between 10° and 15°.

The table 4 comprises a leading portion 5 provided with longitudinal ribs 6 plane on their upper surface and uniformly spaced, and a rear portion 7 plane on its upper surface.

Figure 2:
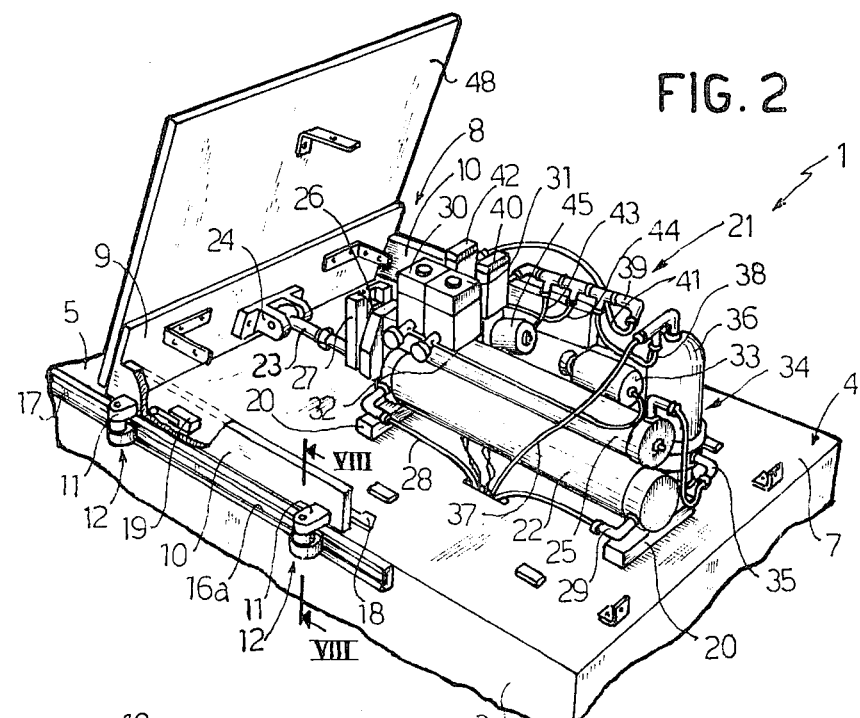
FIGS. 2 and 3 are two different perspective three-quarter views from the top, to enlarged scale and with parts cut away for the sake of clearness, of a rear portion of the device shown in FIG. 1.
Figure 8:
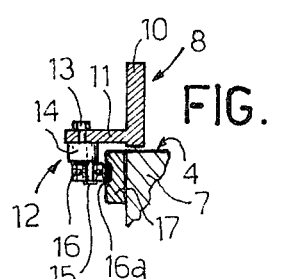
FIG. 8 is a cross-section to enlarged scale along line VIII—VIII of FIG. 2.
Figure 3:
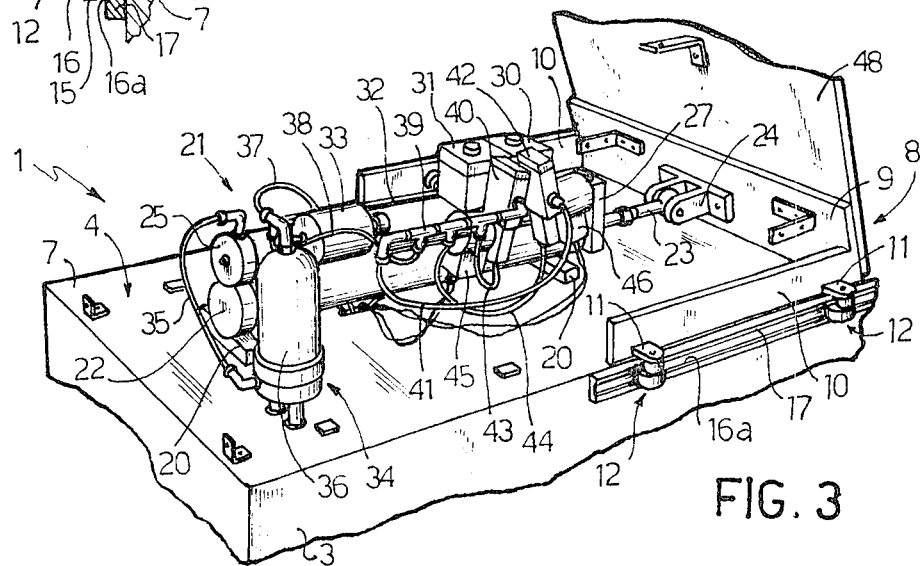

As shown in FIGS. 2 and 3, mounted on the table 4 is a longitudinally movable slide 9 which is substantially U-shaped and comprises a cross member 9 disposed transversally to the ribs 6 and two side members 10 extending rearwardly from the cross member 9 and along the longitudinal edges of the table 4. Extending horizontally outwardly from each side member 10 are two brackets 11, each of which supports a device 12 serving to support the slide 8 and at the same time to adjust the tranversal position of the latter on the table 4. As shown particularly in FIG. 8, each adjustment device 12 comprises a pin 13 pivotally mounted in a hole formed in the associated bracket 11, and pivotally connected, below the latter, to a cylinder 14 from which extends downwardly an eccentric pin 15 rotatably supporting a ball bearing 16, the outer ring of which rolls inside a groove 16a formed along a race 17 applied on the side surface of the casing 3. The height of the devices 12 is such that when the outer ring of the bearings 16 comes into contact with the horizontal lower surface of the grooves 16a the side members 10 and the cross member 9 are slightly raised above the table 4.

Extending from the inner surface of one of side members 10 is an appendix 18 (FIG. 2) arranged to come into contact with the movable element of a microswitch 19 disposed on the table 4 near the leading end of the rear portion 7 and whose function will be explained later.

On the rear portion 7 of table 4 there is rigidly connected by means of supports 20 a thrust assembly, indicated generally by reference numeral 21 (FIGS. 2 and 3), arranged to impart to the slide 8 a back and forth motion along the table 4. The thrust assembly 21 comprises a double-acting air cylinder whose output rod 23 is hinged to a bracket 24 rigidly connected to the rear surface of the cross member 9, and a hydraulic control cylinder 25 whose output rod 26 is rigidly connected by means of a bracket 27 to the output rod 23 of the cylinder 22. The latter is connected, at its opposite ends, to two conduits 28 and 29 (FIG. 2) connected, at their other end, to an air station (not shown) disposed inside the casing 3. The two opposite ends of the hydraulic cylinder 25 are, instead, connected to one another by a hydraulic circuit comprising two valve assemblies 30 and 31 of the on-off type which are driven pneumatically and are disposed in parallel between the leading end of cylinder 25 and the leading end of a conduit 32 connected to the rear end of cylinder 25 through a balancing tank 33. At the side of this latter there is disposed a second balancing tank 34 supported by the table 4 and connected to the rear end of cylinder 25 by means of a conduit 35 in order to maintain substantially constant the pressure of the hydraulic fluid inside cylinder 25. To this end, tank 34 comprises a bell 36 partially filled with hydraulic fluid and connected, at its upper end, to a conduit 37 which, in turn, is connected to the mentioned air station (not shown). Conduit 37, in addition to being connected to the bell 36, is connected also, by means of connection conduit 18, to a feeding manifold 39, one end of which is directly connected to a distributor 40 which controls the valve assembly 31, while its other end is connected, through a conduit 41, to a distributor 42 which controls the valve assembly 30. Distributors 40 and 42 are of the slide valve type and each of them comprises a slider (not shown) which normally shuts off the delivery of air to the respective valve assembly 31, 30 and can move to an opening position under the thrust of compressed air supplied by a respective conduit 43, 44 connected to the manifold 39 and normally closed by a respective electrically operated valve 45, 46 whose operation will be explained later.

The thrust assembly 21 is covered by a telescopic case 47 (FIG. 1) supported by the table 4 and closed at its leading end by a plate 48 rigidly connected to the leading surface of the cross member 9 of the slide 8. The plate 48 extends upwardly and rearwardly from the table 4 so as to form with the leading portion 5 of the latter an angle comprised between 105° and 110°. Two further cases 49 are disposed above the side members 10 in order to cover the support and adjustment devices 12.

As shown, particularly, in FIGS. 4 to 7, two brackets 50, which form an extension of the races 17, are fastened in an axially adjustable manner to the side edges of the table 4 and project with respect to the leading end of the latter for supporting a feeding assembly indicate generally by reference numeral 51. The adjustment of the axial position of the brackets 50 is made possible by the fact that these brackets are provided with an axial slot 52, extending through which is a screw 53 for fastening said brackets to the table 4, and that extending from each race 17 is an adjustable threaded pin 54 (see FIG. 7) arranged to cooperate with the rear end of the respective bracket 50.

The feeding assembly 51 comprises a shaft 55, disposed horizontally and parallel to the plate 48, whose axis is disposed in face and slightly below the leading end of the table 4. The shaft 55 is rotatably supported, at its opposite ends, by the brackets 50 and is provided with a plurality of enlarged sections which form cylindrical drums 56. These drums are uniformly spaced along the length of the shaft 55 and are provided each with a radial notch 57 whose width is at least equal to the thickness of the support bases 2 and which is aligned with the notches 57 of the other drums 56 to define an axial groove extending along the shaft 55. Keyed on the shaft 55 in a substantially central position is a sector gear 58 whose toothing is discontinued in the zone adjacent the notches 57 and which meshes with a rack 59 (FIG. 6) extending below the table 4 in a parallel relationship with the ribs 6 and slidably supported by a bracket 60 rigidly connected to the lower surface of the table 4. The rear end of rack 59 is rigidly connected to the upper end of a plate 61 provided with a central bore 62, inside which there is fixed, by means of a nut 63, the leading threaded end of an output rod 64 of an air cylinder 65 disposed below the table 4 and supported by the same. Keyed on one end of the shaft 55 is a sprocket 66 (FIGS. 4 and 7) which engages with a radial clearance a second sprocket 67 for transmitting the movement to a pick-up assembly 68 arranged to pick up the support bases 2 one by one from the table 4 and to deposit them on the feeding assembly 51. The pick-up assembly 68 comprises a shaft 69 disposed in parallel relationship with the shaft 55 and having keyed thereon, at one of its ends, the sprocket 67. The shaft 69 is disposed at the leading end of the table 4 and is rotatably supported, at its ends, by two equalizers 70 (FIGS. 4 and 7) pivotally mounted on the brackets 50 by means of pivots 71 disposed centrally and in parallel relationship with shaft 69. In order to adjust the transversal position of the shaft 69 with respect to shaft 55, on one of the brackets 50 there is rotatably mounted a cam 72 (FIG. 7) cooperating laterally with the lower portion of the respective equalizer 70 which is maintained in contact with the outer surface of the cam 72 by a spring 73 stretched between the upper end of said equalizer 70 and a stop screw 74 connecting the spring 73 to the respective bracket 50. The lower end of the other equalizer 70 cooperates with an arm 75 (FIG. 4) which serves to actuate a microswitch (not shown) which controls the electrically driven valve 45. The shaft 69 extends in contact with a plurality of curved seatings 76 (FIGS. 5 and 6) formed each on the end of a respective rod 77 (FIGS. 5 and 6) parallel to the ribs 6 and mounted between these latter above the leading end of the leading portion 5 of the table 4. In particular, each rod 77 has a leading portion 78, whose upper surface is disposed substantially at the same level as the surface of the ribs 6, and a lowered rear portion, along which there is formed an axial slot 79 slidably coupled, by means of a securing screw 80 for the rod 77, to the upper surface of the table 4. It is to be noted that, as it appears from FIGS. 5 and 6, the ribs 6 are discontinued before the leading edge of the table 4 and that the bearing seatings 76 for the shaft 69 are disposed above the leading end portion of table 4 which is disposed beyond the leading end of the ribs 6. It is to be noted, moreover, that the seatings 76 cooperate with the side surface of the shaft 69 along an arc sufficient to attach the rods 77 to the shaft 69. As clearly shown in FIGS. 5 and 6, the shaft 69 is provided with a lateral axial recess 81 whose surface is defined by two plane surfaces disposed at a right angle to one another, one of which, disposed in a substantially radial direction and indicated by reference numeral 82, is substantially arranged to align itself with the upper surface of the leading portion 78 of the rods 77 for a determined angular position of the shaft 69. It is important to note that the width of the surface 82 is, at the most, equal to the thickness of one support base 2.

Behind the shaft 69 there is disposed, extending upwards from the upper surface of the table 4 and above the upper surface of the ribs 6, a curved arm 83 which actuates a microswitch (not shown) controlling the electrically driven valve 46.

Figure 5:
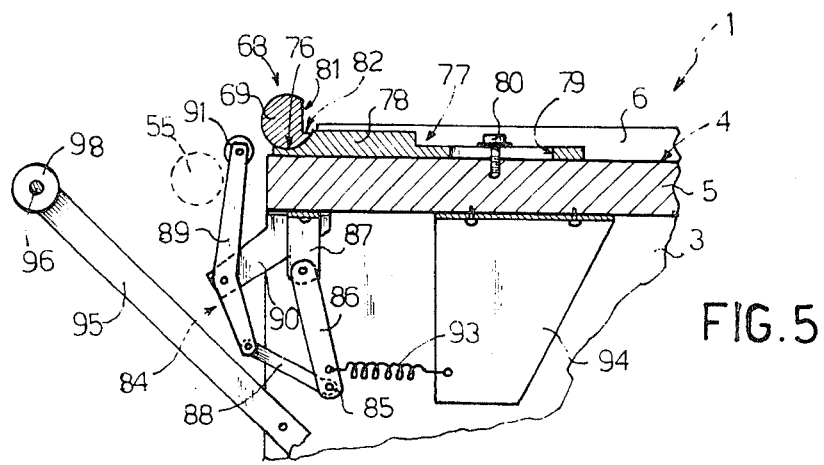
FIGS. 5 and 6 are part cross-sections, with parts cut-away for the sake of clearness, along lines V—V and VI—VI respectively of FIG. 4.
Figure 6:
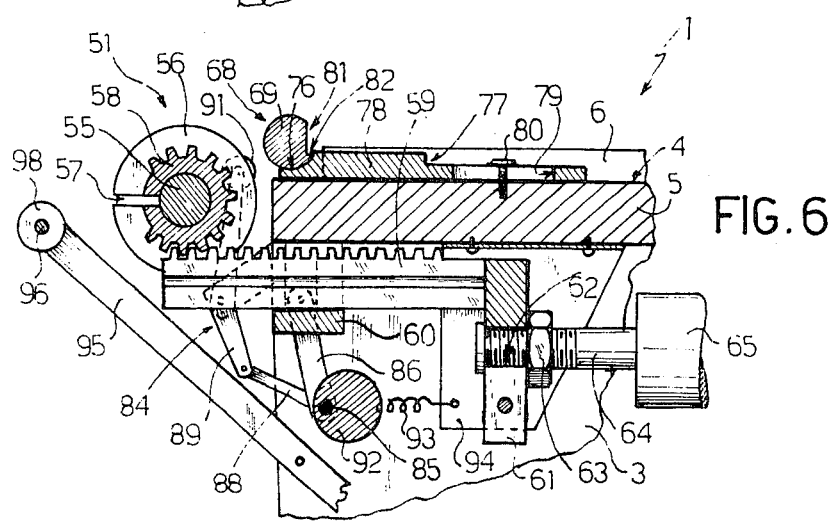
Figure 7:
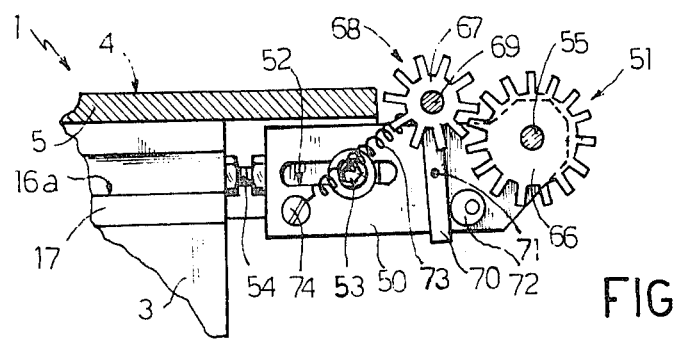
FIG. 7 is a scrap view in enlarged scale in the direction of the arrow VII of FIG. 4.

As shown, in particular, in FIG. 5, disposed adjacent the picking-up assembly 68 is a positioner assembly 84 comprising a horizontal rod 85 disposed below the table 4 and rotatably connected to the lower end of a plurality of cranks 86, each of which is hinged, at its upper end, to a respective bracket 87 extending downwards from the lower surface of the table 4. The rod 85 is rotatably connected to an end of a plurality of links 86, each of which has its other end hinged to the lower end of a respective equalizer 89 centrally hinged on a respective bracket rigidly connected to the table 4 and extending downwards and forwards from the lower surface of said table. The upper end of each equalizer 89 is disposed before the leading end of the table 4 and slightly below the shaft 69 and supports a roller 91 rotatable about an axis parallel to the axis of the shaft 69. The equalizers 89 are maintained, at their back surfaces, in contact with the shaft 55 by the action of a plurality of springs 93, each of which is connected, on one hand, to one of the cranks 86 and on the other hand to a respective bracket 95 disposed behind the rod 85 and rigidly connected to the lower surface of the table 4. A cam 92 is fixed in an angularly adjustable position on a central portion of the rod 85 and is arranged to cooperate with the leading surface of the plate 61 when the extension of the rod 64 exceeds a determined value as function of the angular position of the cam 92.

Hinged on the side walls of the casing 3 are two equalizers 95 arranged to rotate about a horizontal axis parallel to the shafts 55 and 69 and diposed below the assemblies 51 and 84. The corresponding ends of the equalizers 95 are connected to one another by means of two horizontal rods 96 and 97 provided with counterweights 98 and 99 arranged to maintain the two equalizers 95 in an upwardly inclined position in which the rod 96 is disposed before the shaft 55 and at a level which is lower than or equal to that of the shaft 55 and in any case higher than that of the rack 59. The rod 97 is arranged to cooperate, when raised upwardly, with the actuating arm (not shown) of a microswitch (not shown) controlling the hydraulic cylinder 65.

The operation of the feeding device described hereinabove is as follows:

With the machine in unloaded condition, the rod 23 of the air cylinder 22 is in its completely retracted position, so that the plate 48 is disposed in its rear position. The machine is then charged by an operator, who disposes one or more stacks (two stacks in the example shown in FIG. 1) of support bases 2 arranged edgewise on the upper surface of the table 4 and inclined rearwards so as to completely lean on the leading surface of the plate 48. At this point the operator causes compressed air to be fed to the air cylinder 22 through the conduit 29, so as to move forwards the slide 8 and, consequently, the plate 48 and the support bases 2 mounted thereon, which slide with their lower edge in contact with the upper surface of the ribs 6. During this first displacement phase, both valve assemblies 30 and 31 are open, so that the hydraulic fluid contained within the hydraulic cylinder 25 may freely flow through said valve assemblies towards the rear portion of the cylinder 25. The forward movement of the slide 8 continues as long as the first one of the support bases 2, indicated by reference numeral 2a in the FIGS. 9 to 12, presses downwards the arm 83 of the microswitch (not shown) which controls the electrically driven valve 46. As a result of the actuation of the arm 83, the electrically driven valve 46 produces the feeding of compressed air to the interior of the distributor 42 through the conduit 44. The air fed by the conduit 44 causes the slider (not shown) of the distributor 42 to move to a position in which said slider allows the air fed through the conduit 41 to enter inside the valve assembly 30 and to operate this latter so as to close one of the two branches in parallel connected to the conduit 32. Accordingly, a sharp reduction of the feed speed of the rod 23, since at this point the return of the hydraulic fluid can take place only through that of the two parallel branches which estends through the valve assembly 31. The forward movement of the rod 23 in the direction of the arrow 100 of FIG. 9 continues until the support base 2a, sliding above the rods 77, contacts, with its own lower edge, the side surface of the shaft 69 (FIG. 9). The shaft 69 is moved transversely forwards by the pressure exerted by the support base 2a until the equalizer 70, by coming into contact with the arm 75, actuates the microswitch (not shown) controlling the electrically operated valve 45. On actuation of said microswitch, the electrically operated valve 45 allows the input of air under pressure into the interior of the distributor 40 through the conduit 43. This air under pressure operates the slider (not shown) of the distributor 40 so as to allow the input of compressed air into the valve assembly 31 which is operated so as to completely lock the hydraulic fluid return circuit of the cylinder 25 and thus stop the advancement of the rod 23.

During the feed motion of the slide 8, shafts 69 and 55 are at rest in the angular position shown in FIG. 9. In particular, shaft 55 has its grooves 57 oriented fowards and in an angular position corresponding to the completely retracted position of rod 64 and, conseguently, of rack 59, while shaft 69 has its surface 82 disposed slightly below the upper surface of the leading portion 78 of the rods 77. It is important at this point to note that, as clearly shown in FIG. 9, the support base 2a, after having passed the leading edge of the ribs 6 and the rear edge of the recesses 76, falls downwards in the direction of the arrow 101 of FIG. 9 so as to bear with its lower edge on the surface 82.

The actuation of the microswitch controlling the electrically operated valve 45 produces, moreover, the actuation of the air cyclinder 65 with the consequent forwards movement (FIG. 10) of the rod 64 and the rack 59 in the direction of the arrows 102. A forwards movement of the rack 59 produces an anticlockwise rotation, in the direction of the arrow 103 of FIG. 10, of the shaft 55 with consequent displacement of the notches 57 of said shaft towards the shaft 69. In consequence of the engagement of the sprockets 66 and 67, to an anticlockwise rotation of the shaft 55 corresponds a clockwise rotation of the shaft 69 in the direction of the arrows 104 of FIG. 10. During this rotation, the surface 82 of the shaft 69 rises upwardly, so as to raise the support base 2a above the shaft 69 and beyond the same and to make it fall on the rollers 91. These rollers remain substantially in the position shown in FIG. 10 as long as, the rack 59 continuing its movement in the direction of arrow 102, the notches 57 pass slightly the lower edge of the support base 2a. To this angular position of the shaft 55 corresponds a position of the plate 61 in contact with the cam 92. Consequently, a further movement of the rod 64 in the direction of the arrow 102 give rise to a forward movement of the cam 92 and, accordingly, a rotation of the equalizers 89, to which rotation corresponds a movement of the rollers 91 towards the shaft 69. By this movement, the rollers 91 discharge the support base 2a onto the drums 56 making it fall, in the direction of the arrow 105 of FIG. 11, directly into the grooves 57.

The rod 64, after having reached its front dead center, stops and returns, moving in the direction indicated by the arrows 106 of FIG. 11, in consequence of a control pulse delivered by cylinder 65 to an adjustable timer (not shown), by means of which it is possible to impart to the device 1 a timing equal to that of the printed circuit manufacturing machine (not shown) to be fed. The return of the rod 64 produces a clockwise rotation of the shaft 55 in the direction of the arrow 107 (FIG. 11), and a corresponding anticlockwise rotation of the shaft 69 in the direction of the arrow 108. The support base 2a, fixed with its lower edge inside the grooves 57, is entrained by the shaft 55 and made to rotate till it comes into contact with the counterweights 98 of the rod 96 which constitute bearing rollers. The bearing of the support base 2a on the rollers 98 produces a rotation of the equalizers 95 in the direction of the arrows 109 of FIG. 12, and this rotation continues till the rod 97 actuates the microswitch (not shown) which controls the cylinder 65.

At this point the machine stops and will not recommence its cycle till the support base 2a is picked up from the printed circuit manufacturing machine (not shown).

By comparing FIGS. 9 and 12 it can be seen that, at the end of each cycle, the machine assumes again the same initial position, with the surface 82 disposed slightly below the upper surface of the leading portion 78 of the rods 77 and engaged by the lower edge on a new support base 2. In fact, this latter has been fed in the position shown in FIG. 12, since the removal of the support base 2a has allowed a transversal back movement of the shaft 69 under the thrust of the springs 73, with a consequent release of the valve assembly 31 by the electrically operated valve 45 and a braked forward movement of the slide 8 by a distance equal to the thickness of the support base 2a.

The removal of the support base 2a from the position shown in FIG. 12 produces an upward return of the rod 96 and and the execution of a new cycle, during which a further support base 2a is fed to the position shown in FIG. 12.

The cycles of operation follow one another till complete exhaustion of the support bases 2 disposed on the table 4. To the complete exhaustion of the support bases 2 corresponds an axial position of the slide 8 in which the appendix 18 contacts the arm which actuates the microswitch 19. This microswitch, after having been actuated, produces an interruption of the feeding of compressed air through the conduit 29 and causes the feeding of the compressed air through the conduit 28, thereby producing a rapid movement back of the slide 8 and, consequently, of the plate 48.

It is important to note that the picking-up assembly 68 and the positioner assembly 84 are not strictly necessary for the operation of the device 1, inasmuch as the support bases 2 could be fed by simply allowing them to fall on the drums 56, where they could remain until the notches 57 dispose themselves at the lower edges of the support bases. Thus, a feeding device without the assemblies 68 and 84 could operate; however, its operation would certainly be more erratic than that of the device 1 described hereinabove, inasmuch as the picking-up assembly 68 ensures the feeding of the support bases 2 one by one to the feeding assembly 51, while the positioner assembly 84 allows to support the bases 2 fed by the picking-up assembly 68 till the moment at which the notches 57 dispose themselves in an angular position apt to facilitate their perfect engagement with lower edge of the support bases 2 supported by the rollers 91.

In the device 1 described hereinabove, all the control devices are electromechanical devices comprising mechanically operated microswitches; it is obvious, however, that all these devices may be substituted with other devices of different nature. Moreover, the principle of the invention remaining unvaried, many further modifications may be applied to the feeding device described hereinabove, without departing from the scope of the present invention.

What we claim is:

1. A device for step-feedng panels, particularly for feeding printed circuit support bases to a machine for manufacturing said printed circuits, comprising in combination:

a support plane for said panels, the panels being disposed substantially edgewise;

a slide movable along said support plane under the thrust of first driving means;

a bearing plane for said panels which is rigidly connected to the leading end of said slide, said bearing plane being rearwardly inclined, a main feedng shaft disposed horizontally and parallel to said bearing plane, an axial side groove formed on said main feeding shaft having a width sufficient to receive the edge of one of said panels, a pick-up shaft located between the feeding shaft and said support plane, a flat surface extending axially on said pick-up shaft, the arrangement being such that as the slide moves forward the lower edges of the leading panel drops into a trough formed by the flat surface on the pick-up shaft and on rotation of the pick-up shaft the edge of the panel becomes engaged in the axial groove of the main feeding shaft.

2. A device according to claim 1, characterized in that said panels disposed edgewise form at least one stack in which the lowest panel is in contact with said bearing plane; said pick-up shaft being arranged to cooperate with the first panel of said stack and movable with said feed shaft in order to supply thereto, at each cycle, the leading panel after having picked it up from said stack.

3. A device according to claim 2, characterized in that positioner means are interposed between said pick-up shaft and said main feeding shaft in order to support said first panel till it engages said feeding shaft.

4. A device according to claim 1, characterized in that the axial side groove is formed along a plurality of cylindrical sections of the main feeding shaft which have an enlarged cross-section and are distributed along said feeding shaft.

5. A device according to claim 4, characterized in that said feeding shaft has a toothed section which defines a crown gear engaged by gear means on the pick-up shaft.

6. A device according to claim 5, characterized in that there is a second driving means comprising a fluid pressure cylinder and a rack connected to an output rod of said cylinder; said cylinder being disposed below said support plane, and said rack engaging said crown gear to impart to said feeding shaft a reciprocating rotation.

7. A device according to claim 1, characterized in that said pick-up shaft is disposed at the leading end of said support plane and projects above the latter; said pick-up shaft being movable with respect to said support plane, against the action of resilient means, to move from a rest position to an operative position; and sensing means being provided for diactivating said first driving means when said pick-up shaft reaches said operative position.

8. A device according to claim 7, characterized in that said pick-up shaft is a horizontal shaft parallel to said bearing plane, which shaft is rotatably mounted at said first end of said support plane and projects above said end; said shaft having a plane substantially radial surface substantially arranged to align itself, for a determined angular position of the shaft, with said support plane in order to cooperate with a lower edge of said first panel, and being driven by said second driving means to rotate, with a reciprocating rotational movement, starting from said determined angular position; and said plane surface being disposed in such a manner as to rise above said support plane for angular movements of said shaft starting from said determined angular position.

9. A device according to claim 8, characterized in that said pick-up shaft is disposed parallel to said feeding shaft and in a raised position with respect to the same and is connected to it by means a couple of cylindrical pinions meshing with one another and keyed one on the feeding shaft and one on the pick-up shaft; the coupling being such that to an angular displacement of the feeding shaft from said first position to said second position corresponds a reversed rotation of more than 90° of the pick-up shaft starting from said determined angular position.

10. A device according to claim 8, characterized in that said plane surface defines a part of the surface of a recess extending axaily along the side of said pick-up shaft.

11. A device according to claim 3, characterized in that said positioner means comprise at least one support element movable between a first position, in which said support element is disposed on the path followed by said first panel in its movement towards said feeding means, and a second position in which said support element is disposed outside said path; said movable support being displaceable from said first to said second position under the action of said second driving means and against the action of resilient means.

12. A device according to claim 11, characterized in that said positioner means are parallel, articulated and connected to each other for simultaneously rotating about axes perpendicular to the direction of movement of said slide; each of said articulated positioner means comprising a frame rigidly connected to said support plane, and two cranks connected to said frame and to a link; and one of said cranks being constituted by an equalizer having a free arm disposed in face of said first end of said support plane and supporting said support element.

13. Device according to claim 12, characterized in that each said support element is constituted by a roller; said articulated positioner means being disposed below said support plane and being arranged to cooperate with said second driving means, at a determined and adjustable point of the movement of said feeding means from their said first position to their said second position, to move said rollers out of the path followed by said first panel in its movement towards said feeding means.

14. A device according to claim 1, characterized in that said first driving means comprise a fluid pressure cylinder having an output rod connected to said slide, and a hydraulic control circuit comprising a movable element connected to said output rod and acting on a hydraulic fluid contained in said circuit to impart to said fluid a flow direction and speed as functions respectively of the direction and speed of movement of said output rod; there being also provided means on said hydraulic circuit which serve to adjust the speed of said flow as a function of the position of said first panel on said support plane.

15. A device according to claim 14, characterized in that said adjustment means comprise valve means of the on-off type arranged to interrupt said flow along said circuit.

16. A device according to claim 15, characterized in that said valve means are controlled by said pickup shaft.

17. A device according to claim 1, characterized in that said support plane is inclined upwardly and towards said first end.

18. A device according to claim 17, characterized in that said angle of inclination is comprised between 10° and 15°.

19. A device according to claim 1, characterized in that said bearing plane forms with the vertical an angle comprised between 25° and 30°.

* * * * *